US012609692B2

(12) United States Patent
Ko et al.

(10) Patent No.: US 12,609,692 B2
(45) Date of Patent: Apr. 21, 2026

(54) POWER STAGE CIRCUIT, BOOTSTRAP CIRCUIT AND DRIVING METHOD

(71) Applicant: PowerX Semiconductor Corporation, Hsinchu County (TW)

(72) Inventors: Sheng-An Ko, Hsinchu County (TW); Bo-Zhou Ke, Hsinchu County (TW)

(73) Assignee: PowerX Semiconductor Corporation, Hsinchu County (TW)

( * ) Notice: Subject to any disclaimer, the term of this patent is extended or adjusted under 35 U.S.C. 154(b) by 24 days.

(21) Appl. No.: 18/961,485

(22) Filed: Nov. 27, 2024

(65) Prior Publication Data

US 2026/0031805 A1     Jan. 29, 2026

(30) Foreign Application Priority Data

Jul. 23, 2024     (TW) ................................. 113127603

(51) Int. Cl.
*H03K 17/06*          (2006.01)
*H02M 1/088*          (2006.01)

(52) U.S. Cl.
CPC .......... *H03K 17/063* (2013.01); *H02M 1/088* (2013.01)

(58) Field of Classification Search
CPC .................................................. H03K 17/063
USPC ................................................ 327/108–112
See application file for complete search history.

(56) References Cited

U.S. PATENT DOCUMENTS

RE35,745 E     3/1998   Barsanti et al.
8,536,808 B2   9/2013   Sarig et al.

| | | |
|---|---|---|
| 10,008,930 B1 | 6/2018 | Yang |
| 10,536,087 B1 | 1/2020 | He et al. |
| 2015/0042298 A1 | 2/2015 | Kung et al. |
| 2017/0054369 A1 | 2/2017 | Chin et al. |
| 2017/0324411 A1* | 11/2017 | Gong ...................... H02M 3/07 |
| 2019/0326817 A1 | 10/2019 | Zhang |
| 2020/0036372 A1 | 1/2020 | Shankar |
| 2021/0320649 A1 | 10/2021 | Wang et al. |

FOREIGN PATENT DOCUMENTS

| | | |
|---|---|---|
| CN | 105827101 B | 2/2019 |
| TW | 202029628 A | 8/2020 |
| TW | M662451 U | 11/2024 |
| WO | 2013138750 A1 | 9/2013 |

* cited by examiner

*Primary Examiner* — Tomi Skibinski
(74) *Attorney, Agent, or Firm* — CKC & Partners Co., LLC

(57)          ABSTRACT

The application provides a power stage circuit, a bootstrap circuit and a driving method. The power stage circuit includes a switch circuit, a driving circuit and the bootstrap circuit. The switch circuit includes a low-side switch and a high-side switch coupled to a switching node. The driving circuit is configured to drive the low-side switch and the high-side switch to be alternatively turned on. The bootstrap circuit is coupled to the switch circuit and the driving circuit, and includes a bootstrap capacitor. The bootstrap capacitor is coupled to the switching node and a bootstrap node. During a period when both the low-side switch and the high-side switch are turned off, the bootstrap capacitor is charged when a voltage difference between its two terminals, which is decreased from a preset voltage value, reaches a preset limit voltage value, to maintain the voltage difference at the preset limit voltage value.

20 Claims, 6 Drawing Sheets

300

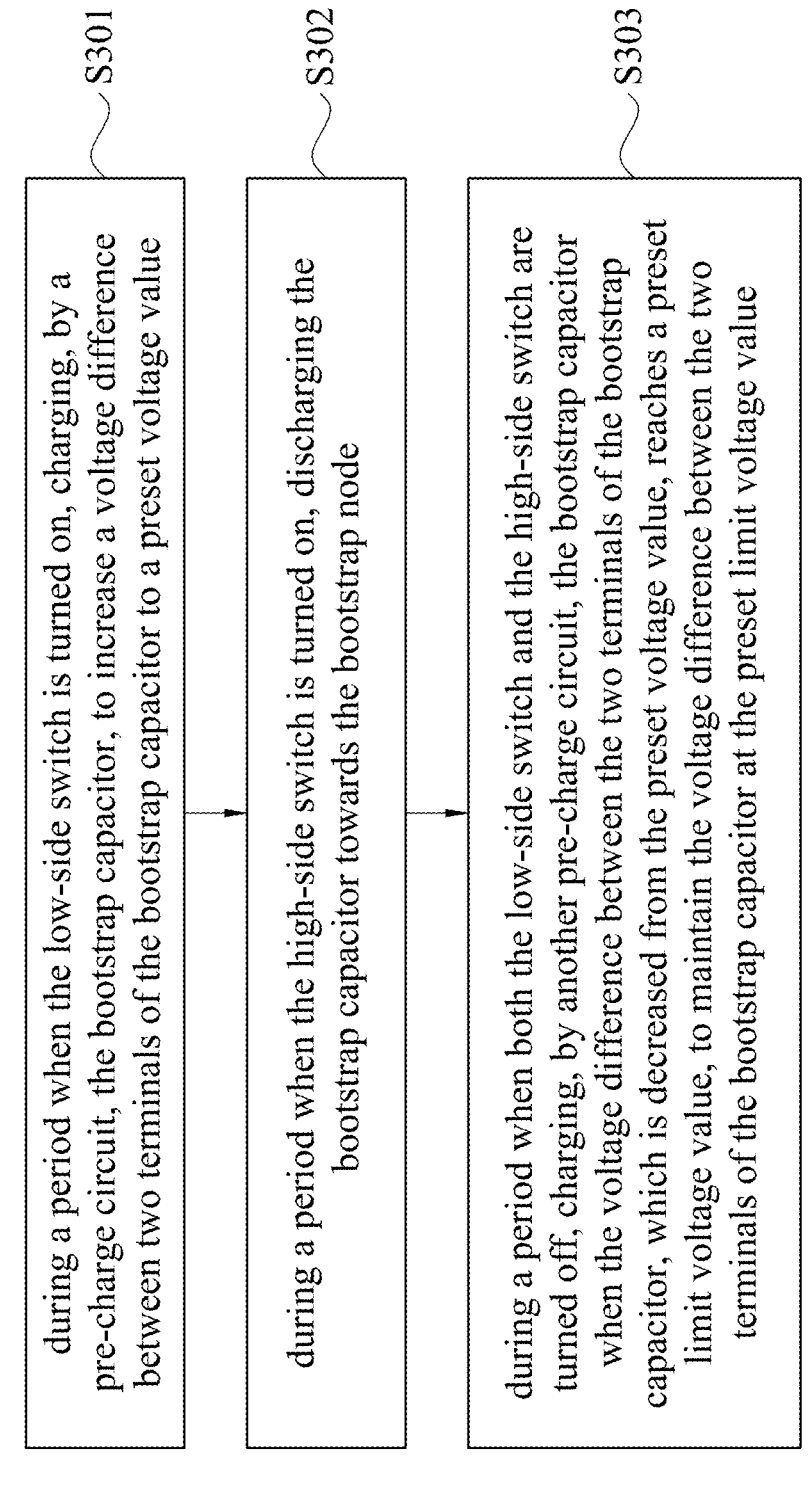

during a period when the low-side switch is turned on, charging, by a pre-charge circuit, the bootstrap capacitor, to increase a voltage difference between two terminals of the bootstrap capacitor to a preset voltage value — S301 during a period when the high-side switch is turned on, discharging the bootstrap capacitor towards the bootstrap node — S302 during a period when both the low-side switch and the high-side switch are turned off, charging, by another pre-charge circuit, the bootstrap capacitor when the voltage difference between the two terminals of the bootstrap capacitor, which is decreased from the preset voltage value, reaches a preset limit voltage value, to maintain the voltage difference between the two terminals of the bootstrap capacitor at the preset limit voltage value — S303

Fig. 3

POWER STAGE CIRCUIT, BOOTSTRAP CIRCUIT AND DRIVING METHOD

CROSS-REFERENCE TO RELATED APPLICATION

This application claims priority to Taiwan Application Serial Number 113127603, filed on Jul. 23, 2024, which is herein incorporated by reference in its entirety.

BACKGROUND

Field of Invention

This disclosure relates to a power stage circuit, a bootstrap circuit and a driving method, in particular to a power stage circuit, a bootstrap circuit and a driving method which are applicable to a power convertor circuit.

Description of Related Art

In some related arts of a power stage module, when the power stage module is operated in a discontinuous-conduction mode (DCM) for too long, a bootstrap capacitor in the power stage module is often over-discharged, which causes a high-side switch in the power stage module to fail to be turned on when it needs to be turned on later. Therefore, it is necessary to propose new circuits and/or methods to solve the above problems.

SUMMARY

An aspect of present disclosure relates to a power stage circuit. The power stage circuit includes a switch circuit, a driving circuit and a bootstrap circuit. The switch circuit includes a low-side switch and a high-side switch, wherein the low-side switch and the high-side switch are coupled to a switching node of the power stage circuit. The driving circuit is coupled to the low-side switch and the high-side switch, and is configured to drive the low-side switch and the high-side switch to be alternatively turned on according to a control signal. The bootstrap circuit is coupled to the switch circuit and the driving circuit, and includes a bootstrap capacitor and a first pre-charge circuit, wherein the bootstrap capacitor is coupled to the switching node and a bootstrap node of the power stage circuit. The first pre-charge circuit includes a charging switch circuit and a voltage source, the voltage source is coupled to the switching node, and the charging switch circuit is coupled to the voltage source and the bootstrap node. During a period when both the low-side switch and the high-side switch are turned off, the first pre-charge circuit is configured to charge the bootstrap capacitor when a voltage difference between two terminals of the bootstrap capacitor, which is decreased from a preset voltage value, reaches a preset limit voltage value, to maintain the voltage difference at the preset limit voltage value. The preset limit voltage value is determined according to a fixed voltage of the voltage source and an on-state threshold voltage of the charging switch circuit.

Another aspect of present disclosure relates to a bootstrap circuit. The bootstrap circuit is applicable to a power stage circuit including a driving circuit, a high-side switch and a low-side switch, and includes a bootstrap capacitor, a first pre-charge circuit and a second pre-charge circuit. The bootstrap capacitor is coupled to a switching node and a bootstrap node of the power stage circuit, wherein the high-side switch and the low-side switch are coupled to the switching node, and the driving circuit is coupled to the switching node and the bootstrap node. The first pre-charge circuit is coupled to the bootstrap node, and is configured to charge the bootstrap capacitor during a period when the low-side switch is turned on, to increase a voltage difference between two terminals of the bootstrap capacitor to a preset voltage value. The second pre-charge circuit is coupled to the switching node and the bootstrap node, and is configured to charge the bootstrap capacitor when the voltage difference, which is decreased from the preset voltage value, reaches a preset limit voltage value during a period when both the low-side switch and the high-side switch are turned off, to maintain the voltage difference at the preset limit voltage value. The second pre-charge circuit includes a voltage source and a charging switch circuit, the voltage source is coupled to the switching node, and the charging switch circuit is coupled to the voltage source and the bootstrap node. The preset limit voltage value is determined according to a fixed voltage of the voltage source and an on-state threshold voltage of the charging switch circuit.

Another aspect of present disclosure relates to a driving method. The driving method is applicable to a bootstrap circuit of a power stage circuit, and includes: during a period when a low-side switch of the power stage circuit is turned on, charging, by a first pre-charge circuit of the bootstrap circuit, a bootstrap capacitor of the bootstrap circuit, to increase a voltage difference between two terminals of the bootstrap capacitor to a preset voltage value; during a period when a high-side switch of the power stage circuit is turned on, discharging the bootstrap capacitor towards a bootstrap node coupled to the first pre-charge circuit and the bootstrap capacitor; and during a period when both the low-side switch and the high-side switch are turned off, charging, by a second pre-charge circuit of the bootstrap circuit, the bootstrap capacitor when the voltage difference, which is decreased from the preset voltage value, reaches a preset limit voltage value, to maintain the voltage difference at the preset limit voltage value. The second pre-charge circuit includes a voltage source and a charging switch circuit, the charging switch circuit is coupled to the voltage source and the bootstrap node, and the preset limit voltage value is determined according to a fixed voltage of the voltage source and an on-state threshold voltage of the charging switch circuit.

In sum, by maintaining the voltage difference between the two terminals of the bootstrap capacitor at the preset limit voltage value in the discontinuous-conduction mode, when the high-side switch is required to be turned on, the driving circuit can drive the high-side switch to switch to the turned-on state through the high-side driving signal at the enabled level without encountering the problems that the high-side switch cannot be turned on due to the over-discharge of the bootstrap capacitor. Therefore, the power stage circuit, the bootstrap circuit and the driving method of the present disclosure have advantages of high stability.

BRIEF DESCRIPTION OF THE DRAWINGS

The present disclosure can be more fully understood by reading the following detailed description of the embodiment, with reference made to the accompanying drawings as follows:

FIG. 3 is a flow diagram of a driving method for a bootstrap circuit in a power stage circuit in accordance with some embodiments of the present disclosure;

DETAILED DESCRIPTION

The embodiments are described in detail below with reference to the appended drawings to better understand the aspects of the present application. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

As used herein, "coupled" and "connected" may be used to indicate that two or more elements physical or electrical contact with each other directly or indirectly, and may also be used to indicate that two or more elements cooperate or interact with each other.

Figure 1:
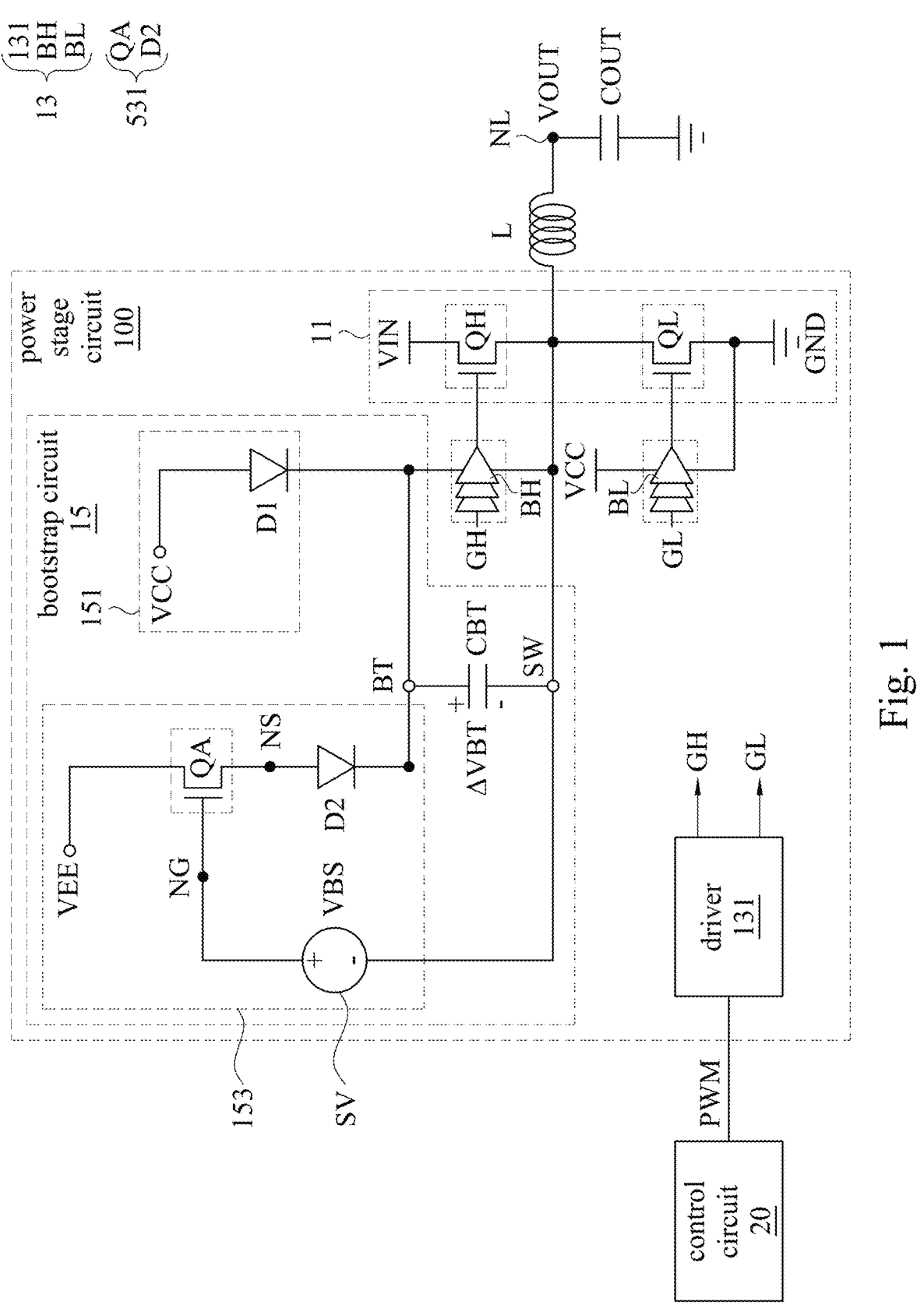
FIG. 1 is a circuit block diagram of a power stage circuit and a control circuit thereof in accordance with some embodiments of the present disclosure.

Referring to FIG. 1, FIG. 1 is a circuit block diagram of a power stage circuit 100 and a control circuit 20 in accordance with some embodiments of the present disclosure. In some embodiments, the power stage circuit 100 and the control circuit 20 can constitute a power convertor circuit such as a DC/DC convertor, a single phase or multi-phase buck convertor, etc. The power stage circuit 100 can be coupled to a load node NL through an inductance element L, and the load node NL can be coupled to a load device (not shown in drawings) such as a central processing unit (CPU). In such way, the power convertor circuit constituted by the power stage circuit 100 and the control circuit 20 can supply power to the load device.

In some embodiments, as shown in FIG. 1, the power stage circuit 100 includes a switch circuit 11, a driving circuit 13 and a bootstrap circuit 15. The switch circuit 11 includes a high-side switch QH and a low-side switch QL. The high-side switch QH is coupled to an input signal VIN and a switching node SW of the power stage circuit 100. The low-side switch QL is coupled to the switching node SW and a ground signal GND. In addition, the switching node SW is coupled to the load node NL through the inductance element L. In particular, each of the hide-side switch QH and the low-side switch QL can be implemented by a transistor (e.g., an N-type metal oxide semiconductor (MOS) transistor), but the present disclosure is not limited thereto.

As shown in FIG. 1, the driving circuit 13 includes a driver 131, a high-side buffer circuit BH and a low-side buffer circuit BL. The driver 131 is coupled to the control circuit 20 and configured to receive a control signal PWM outputted by the control circuit 20 and further to output a high-side driving signal GH and a low-side driving signal GL according to the control signal PWM. A signal input terminal of the high-side buffer circuit BH is coupled to the driver 131 to receive the high-side driving signal GH, and a signal output terminal of the high-side buffer circuit BH is coupled to the high-side switch QH. A signal input terminal of the low-side buffer circuit BL is coupled to the driver 131 to receive the low-side driving signal GL, and a signal output terminal of the low-side buffer circuit BL is coupled to the low-side switch QL. From the descriptions of the driving circuit 13, it can be seen that, in some embodiments, the driving circuit 13 is coupled to the high-side switch QH and the low-side switch QL and further to the control circuit 20.

In the above embodiments, the driver 131 can be implemented by one or more gate drivers, and each of the high-side buffer circuit BH and the low-side buffer circuit BL can be implemented by one or more buffer amplifiers. That is, the high-side driving signal GH and the low-side driving signal GL can be buffered to a gate terminal of the transistor in the high-side switch QH and a gate terminal of the transistor in the low-side switch QL, respectively.

Figure 2A:
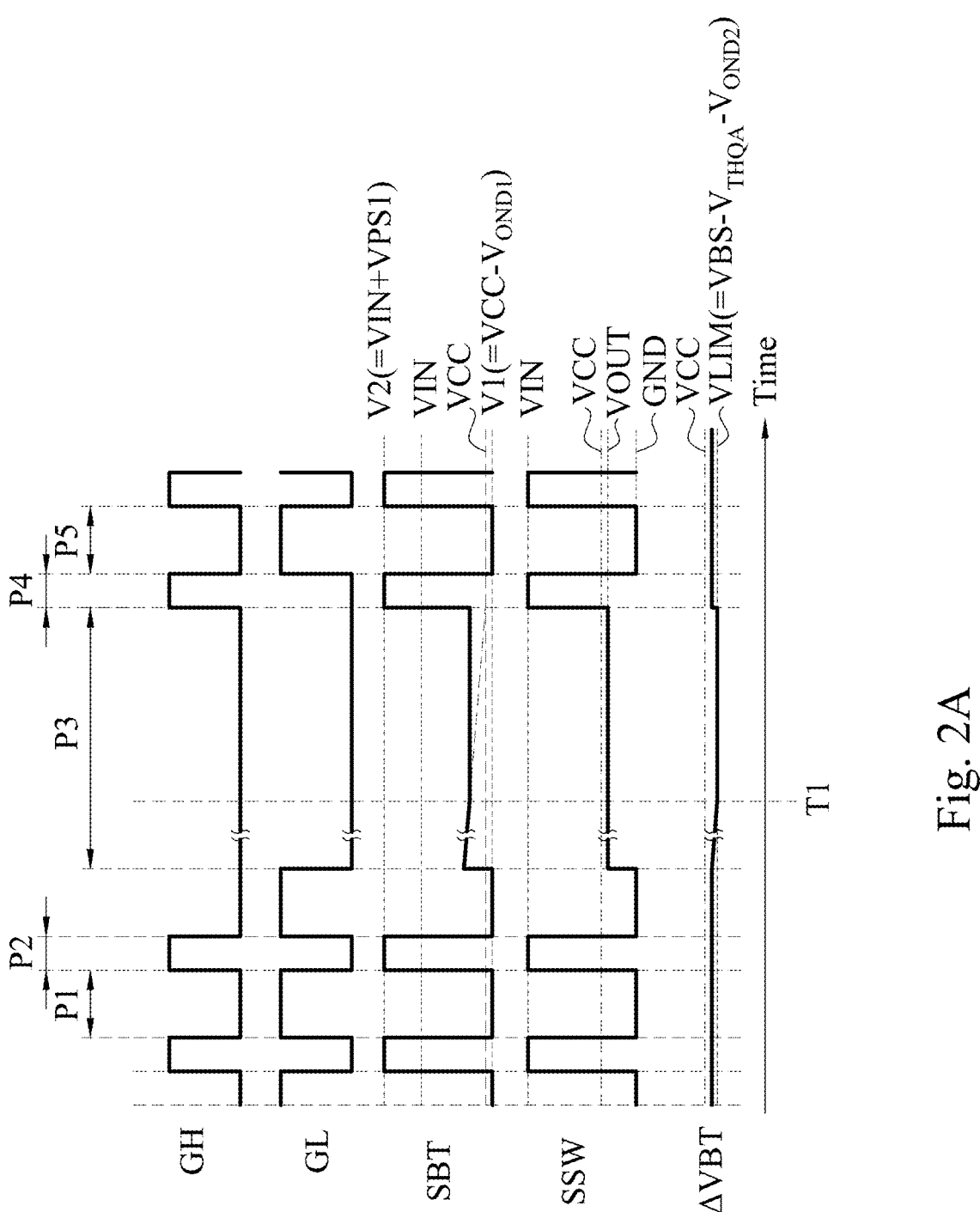
FIG. 2A is a timing diagram of some signals related to a power stage circuit in accordance with some embodiments of the present disclosure.

In some embodiments, the driving circuit 13 is configured to drive the low-side switch QL and the hide-side switch QH to be alternatively turned on according to the control signal PWM. In particular, the control signal PWM can be a periodic signal such as a pulse width modulation signal. The operation that the driving circuit 13 drives the switch circuit 11 would be further described with reference to FIG. 2A. FIG. 2A is a timing diagram of some signals related to the power stage circuit 100 in accordance with some embodiments of the present disclosure.

In some embodiments, as shown in FIG. 2A, during a period (e.g., periods P1-P2 and P4-P5 in FIG. 2A) when the power stage circuit 100 operates in a continuous-conduction mode (CCM), the high-side driving signal GH and the low-side driving signal GL which are outputted according to the control signal PWM are also the periodic signals. The high-side driving signal GH and the control signal PWM are in phase substantially. For example, when the high-side driving signal GH is at an enabled level (e.g., a high voltage level as shown in FIG. 2A), the control signal PWM may be also at the enabled level. The high-side driving signal GH (or the control signal PWM) and the low-side driving signal GL are out of phase substantially. For example, when the high-side driving signal GH is at a disable level (e.g., a low voltage level as shown in FIG. 2A), the low-side driving signal GL may be at the enabled level. In particular, the enabled level can be a voltage level capable of turning the high-side switch QH or the low-side switch QL on, and the disable level can be a voltage level capable of turning the high-side switch QH or the low-side switch QL off. From the above descriptions, it can be seen that the high-side switch QH and the low-side switch QL are driven by the high-side driving signal GH and the low-side driving signal GL to be alternatively turned on.

When the high-side switch QH and the low-side switch QL are alternatively turned on, a voltage signal SSW is generated at the switching node SW. Referring to FIG. 2A, a voltage level of this voltage signal SSW is switched between a voltage level of the input signal VIN and a voltage level of the ground signal GND according to the timing sequence. In the embodiments of FIG. 1, a capacitance element COUT is coupled between the load node NL and the ground signal GND, and the capacitance element COUT and the inductance element L constitute a circuit such as a low-pass filter circuit. This circuit can be configured to process the voltage signal SSW to generate an output signal VOUT at the load node NL. In brief, the driving circuit 13 can be configured to drive the switch circuit 11 to generate the output signal VOUT at the load node NL. It should be understood that the power convertor circuit constituted by the power stage circuit 100 and the control circuit 20 can supply power to the load device through the output signal VOUT.

It is noted that the driving circuit 13 is not limited to drive the low-side switch QL and the high-side switch QH to be alternatively turned on. In some embodiments, the power stage circuit 100 can be controlled by the control circuit 20 to operate in a discontinuous-conduction mode (DCM). During a period (e.g., a period P3) of the discontinuous-conduction mode, the driving circuit 13 switches both the high-side driving signal GH and the low-side driving signal GL to the disable level to turn both the high-side switch QH and the low-side switch QL off.

In accordance with the above descriptions of the driving circuit 13, a power source terminal of the low-side buffer circuit BL is coupled to a power source signal VCC, and a ground terminal thereof is coupled to the ground signal GND. Because a voltage level of the power source signal VCC and the voltage level of the ground signal GND are stable, the low-side buffer circuit BL can stably buffer the low-side driving signal GL to the low-side switch QL, which ensures that the low-side switch QL is turned on or off at a preset time.

A power source terminal of the high-side buffer circuit BH is coupled to a bootstrap node BT of the power stage circuit 100, and a ground terminal thereof is coupled to the switching node SW. It is noted that the power source terminal of the high-side buffer circuit BH cannot be directly connected to the power source signal VCC as the low-side buffer circuit BL. In cases where the power source terminal of the high-side buffer circuit BH is directly connected to the power source signal VCC, because the voltage signal SSW at the switching node SW (i.e., the ground terminal of the high-side buffer circuit BH) is switched to the voltage level of the input signal VIN when the high-side switch QH is turned on, the high-side buffer circuit BH is unable to buffer the high-side driving signal GH to the high-side switch QH, so that the high-side switch QH is turned off. In view of these, the bootstrap circuit 15 is required to encourage the power stage circuit 100 to control a voltage difference between the bootstrap node BT and the switching node SW, thereby ensuring that the high-side switch QH can buffer the high-side driving signal GH to the high-side switch QH at a preset time (that is, ensuring that the high-side switch QH is turned on at the preset time).

Referring to FIG. 1 again, the bootstrap circuit 15 includes a bootstrap capacitor CBT, a pre-charge circuit 151 and a pre-charge circuit 153. The bootstrap capacitor CBT is coupled to the switching node SW and the bootstrap node BT. The pre-charge circuit 151 is coupled to the bootstrap node BT. In addition, the pre-charge circuit 153 is also coupled to the switching node SW and the bootstrap node BT. From the above descriptions of the bootstrap circuit 15, the high-side buffer circuit BH and low-side buffer circuit BL, it can be seen that, in some embodiments, the bootstrap circuit 15 is coupled to the switch circuit 11 and the driving circuit 13.

In some further embodiments, the pre-charge circuit 151 includes a unidirectional switch D1. In particular, the unidirectional switch D1 can be implemented by a diode. A first terminal of the unidirectional switch D1 (e.g., an anode terminal of the diode) is coupled to the power source signal VCC, and a second terminal thereof (e.g., a cathode terminal of the diode) is coupled to the bootstrap node BT.

The unidirectional switch D1 is switched to a turned-on state when being operated with a forward bias, so that a voltage difference between two terminals of the unidirectional switch D1 is changed to an on-state voltage $V_{OND1}$ of the unidirectional switch D1. In this embodiment, the unidirectional switch D1 is implemented by a Schottky diode, whose on-state voltage $V_{OND1}$ is, for example, 0.2 volts. When the unidirectional switch D1 is in the turned-on state, a current can flow from the first terminal of the unidirectional switch D1 to the second terminal thereof. The unidirectional switch D1 is switched to a turned-off state when being operated with a reverse bias, which results in that no current can flow from the first terminal of the unidirectional switch D1 to the second terminal thereof.

Moreover, the pre-charge circuit 153 includes a voltage source SV and a charging switch circuit 531, and the charging switch circuit 531 includes a charging switch QA and a unidirectional switch D2. In particular, the unidirectional switch D2 can be implemented by a diode, and the charging switch QA can be implemented by a transistor (e.g., an N-type MOS transistor). In this embodiment, the unidirectional switch D2 is implemented by a Schottky diode, whose on-state voltage $V_{OND2}$ is, for example, 0.2 volts. In addition, in one embodiment, when the charging switch QA is implemented by an N-type MOS transistor, a threshold voltage $V_{THQA}$ of the charging switch QA is, for example, 0.7 volts. The voltage source SV is coupled to the switching node SW, and is coupled with a control terminal of the charging switch QA (e.g., a gate terminal of the transistor) at a node NG. A first terminal of the charging switch QA (e.g., a drain terminal of the transistor) is coupled to a power source signal VEE. A first terminal of the unidirectional switch D2 (e.g., an anode terminal of the diode) is coupled with a second terminal of the charging switch QA (e.g., a source terminal of the transistor) at a node NS, and a second terminal of the unidirectional switch D2 (e.g., a cathode terminal of the diode) is coupled to the bootstrap node BT. From the above descriptions, it can be seen that, in some embodiments, the voltage source SV is coupled to the switching node SW, the charging switch circuit 531 is coupled with the voltage source SV at the node NG and further coupled to the power source signal VEE and the bootstrap node BT, and the charging switch QA is coupled between the voltage source SV, the power source signal VEE and the bootstrap node BT. In the embodiments of the present disclosure, an on-state threshold voltage of the charging switch circuit 531 is determined by the threshold voltage $V_{THQA}$ and the on-state voltage $V_{OND2}$. In one embodiment, the on-state threshold voltage of the charging switch circuit 531 is equal to the threshold voltage $V_{THQA}$ plus the on-state voltage $V_{OND2}$, for example 0.9 volts.

In some embodiments, a voltage level of the power source signal VEE is higher than the voltage level of the power source signal VCC. In other embodiments, the voltage level of the power source signal VEE is higher than the sum of a voltage level of the output signal VOUT and a preset limit voltage value VLIM. For example, the voltage level of the power source signal VEE can be the same as the voltage level of the input signal VIN. In the embodiments of the present disclosure, the preset limit voltage value VLIM is determined by a fixed voltage VBS of the voltage source SV, the threshold voltage $V_{THQA}$ of the charging switch QA and the on-state voltage $V_{OND2}$ of the unidirectional switch D2. In one embodiment, the preset limit voltage value VLIM is determined by the fixed voltage VBS of the voltage source SV and the sum of the threshold voltage $V_{THQA}$ of the charging switch QA and the on-state voltage $V_{OND2}$ of the unidirectional switch D2 (i.e., the sum is equal to the on-state threshold voltage of the charging switch circuit 531, such as 0.9 volts). In one embodiment, as shown in FIG. 2A, the preset limit voltage value VLIM is equal to the fixed voltage VBS minus the on-state threshold voltage of the charging switch circuit 531. For example, when the fixed voltage VBS is 5 volts, the preset limit voltage value VLIM is 4.1 volts.

Similarly, the unidirectional switch D2 is switched to the turned-on state when being operated with a forward bias. In such condition, a current can flow from the first terminal of the unidirectional switch D2 to the second terminal thereof. The unidirectional switch D1 is switched to the turned-off state when being operated with a reverse bias, which results in that no current can flow from the first terminal of the unidirectional switch D2 to the second terminal thereof.

When a voltage drop between the node NG and the bootstrap node BT is greater than or equal to the on-state threshold voltage of the charging switch circuit 531 (which is equal to the threshold voltage $V_{THQA}$ plus the on-state voltage $V_{OND2}$, for example 0.9 volts), the charging switch QA and the unidirectional switch D2 are switched to the turned-on state, so that a current can flow between the first terminal of the charging switch QA and the bootstrap node BT. When the voltage drop between the node NG and the bootstrap node BT is smaller than the on-state threshold voltage, the charging switch QA and the unidirectional switch D2 are switched to the turned-off state, so that no current can flow between the first terminal of the charging switch QA and the bootstrap node BT.

Figure 2B:
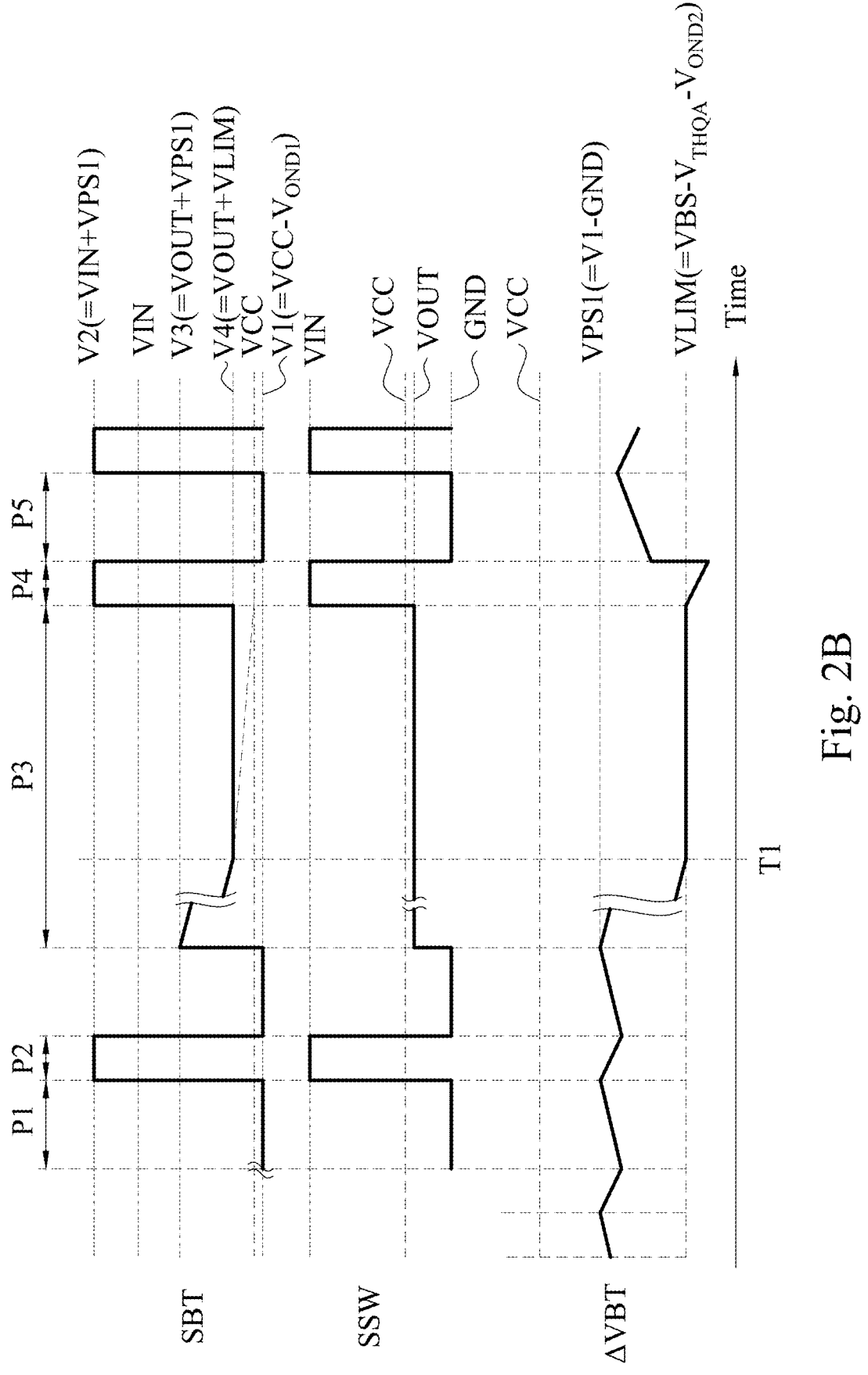
FIG. 2B is an enlarged timing diagram of some signals in FIG. 2A in accordance with some embodiments of the present disclosure.

The operation of the bootstrap circuit 15 would be described with reference to FIG. 2A, FIG. 2B and FIG. 3. FIG. 2B is an enlarged diagram of a voltage signal SBT at the bootstrap node BT and a voltage difference ΔVBT between two terminals of the bootstrap capacitor CBT in FIG. 2A. FIG. 3 is a flow diagram of a driving method 300 in accordance with some embodiments of the present disclosure. In some embodiments, as shown in FIG. 3, the driving method 300 includes operations S301-S303, but the present disclosure is not limited thereto.

In the operation S301, during a period P1 when the low-side switch QL is turned on, the pre-charge circuit 151 charges the bootstrap capacitor CBT to increase the voltage difference ΔVBT between the two terminals of the bootstrap capacitor CBT (i.e., the voltage difference between the bootstrap node BT and the switching node SW) to a preset voltage value VPS1.

During the period P1, as shown in FIG. 2A, a voltage level of the voltage signal SSW at the switching node SW (i.e., a voltage level of the switching node SW) is switched to the voltage level of the ground signal GND (i.e., a ground voltage level). In an initial stage of the period P1, a voltage level of the voltage signal SBT at the bootstrap node BT (i.e., a voltage level of the bootstrap node BT) is the voltage level of the ground signal GND plus the voltage difference ΔVBT, and is lower than the voltage level of the power source signal VCC, so that the unidirectional switch D1 is operated with the forward bias. In such way, the voltage level of the voltage signal SBT is switched to the voltage level of the power source signal VCC minus the on-state voltage $V_{OND1}$ of the unidirectional switch D1 (i.e., a voltage level V1 as shown in FIG. 2A). As shown in FIG. 2B, because the voltage difference ΔVBT does not reach the voltage level V1 minus the voltage level of the ground signal GND (i.e., the preset voltage value VPS1) yet, the pre-charge circuit 151 charges the bootstrap capacitor CBT to increase the voltage difference ΔVBT to the preset voltage value VPS1. It should be understood that when the voltage level of the ground signal GND is substantially 0 volt, the preset voltage value VPS1 is equivalent to the voltage level of the power source signal VCC minus the on-state voltage $V_{OND1}$ of the unidirectional switch D1, that is, the preset voltage value VPS1 is equal to the voltage level V1.

In addition, it can be seen from FIG. 1 and FIG. 2A that during the period P1, a voltage level of the node NG is the voltage level of the ground signal GND (i.e., the voltage level of the voltage signal SSW at the switching node SW) plus the fixed voltage VBS. In some embodiments, the fixed voltage VBS is equal to or approximates the voltage level of the power source signal VCC (e.g., 5 volts). As the above descriptions, the voltage level of the voltage signal SBT is the voltage level V1. That is to say, a difference between the voltage level of the node NG and the voltage level of the voltage signal SBT (which is approximately equal to the on-state voltage $V_{OND1}$) is smaller than the on-state threshold voltage. Thus, both the charging switch QA and the unidirectional switch D2 in the pre-charge circuit 153 are turned off, so that the pre-charge circuit 153 stops charging the bootstrap capacitor CBT during the period P1.

In some practical applications, during the period P1, the voltage level of the voltage signal SSW at the switching node SW is 0 volt, the voltage level of the voltage signal SBT at the bootstrap node BT is 4.8 volts, the preset voltage value VPS1 is 4.8 volts, and the voltage level of the node NG is 5 volts.

In the operation S302, during a period P2 when the high-side switch QH is turned on, the bootstrap capacitor CBT is discharged towards the bootstrap node BT.

During the period P2, as shown in FIG. 2A, the voltage signal SSW at the switching node SW (i.e., the voltage level of the switching node SW) is switched to the voltage level of the input signal VIN (i.e., an input voltage level). In an initial stage of the period P2, as shown in FIG. 2B, the voltage level of the voltage signal SBT at the bootstrap node BT (i.e., the voltage level of the bootstrap node BT) is switched to the voltage level of the input signal VIN plus the voltage difference ΔVBT which is substantially equal to the preset voltage value VPS1 (that is, the voltage signal SBT is switched to a voltage level V2 as shown in FIG. 2B). Therefore, the voltage level of the voltage signal SBT is higher than the voltage level of the power source signal VCC, so that the unidirectional switch D1 is operated with the reverse bias and switched to the turned-off state.

In addition, during the period P2, the voltage level of the node NG is the voltage level of the input signal VIN (i.e., the voltage level of the voltage signal SSW at the switching node SW) plus the fixed voltage VBS. Also, as the above descriptions, the voltage level of the voltage signal SBT at the bootstrap node BT is the voltage level V2 and slightly lower than the voltage level of the node NG. That is to say, the difference between the voltage level of the node NG and the voltage level of the voltage signal SBT is still smaller than the on-state threshold voltage. Thus, both the charging switch QA and the unidirectional switch D2 in the pre-charge circuit 153 are turned off.

In brief, during the period P2, the voltage signal SBT at the bootstrap node BT is switched to the voltage level V2, so that the unidirectional switch D1, the charging switch QA and the unidirectional switch D2 are switched to the turned-off state. In other words, both the pre-charge circuit 151 and the pre-charge circuit 153 stop charging the bootstrap capacitor CBT during the period P2. In such way, the bootstrap capacitor CBT is discharged towards the bootstrap node BT (the voltage difference $\Delta$VBT is decreased correspondingly) to supply power to the high-side buffer circuit BH in the driving circuit 13.

In some practical applications, during the period P2, the voltage level of the voltage signal SSW at the switching node SW is 12 volts, the voltage level of the voltage signal SBT at the bootstrap node BT is 16.8 volts, and the voltage level of the node NG is 17 volts.

In some embodiments, the control circuit 20 controls the power stage circuit 100 to operate in the discontinuous-conduction mode. Thus, the operation S303 is performed.

In the operation S303, during a period P3 when both the low-side switch QL and the high-side switch QH are turned off, the pre-charge circuit 153 charges the bootstrap capacitor CBT when the voltage difference $\Delta$VBT between the two terminals of the bootstrap capacitor CBT, which is decreased from the preset voltage value VPS1, reaches the preset limit voltage value VLIM, to maintain the voltage difference $\Delta$VBT between the two terminals of the bootstrap capacitor CBT at the preset limit voltage value VLIM.

During the period P3, as shown in FIG. 2A, the voltage level of the voltage signal SSW at the switching node SW (i.e., the voltage level of the switching node SW) is switched to the voltage level of the output signal VOUT (i.e., an output voltage level). In an initial stage of the period P3, as shown in FIG. 2B, the voltage level of the voltage signal SBT at the bootstrap node BT (i.e., the voltage level of the bootstrap node BT) is switched to the voltage level of the output signal VOUT plus the voltage difference $\Delta$VBT which is substantially equal to the preset voltage value VPS1 (that is, the voltage signal SBT is switched to a voltage level V3 as shown in FIG. 2B). Therefore, the voltage level of the voltage signal SBT is higher than the voltage level of the power source signal VCC, so that the unidirectional switch D1 is operated with the reverse bias.

In addition, during the initial stage of the period P3, the voltage level of the node NG is the voltage level of the output signal VOUT (i.e., the voltage level of the voltage signal SSW at the switching node SW) plus the fixed voltage VBS. Also, as the above descriptions, the voltage level of the voltage signal SBT at the bootstrap node BT is the voltage level of the output signal VOUT plus the preset voltage value VPS1 (that is, the voltage signal SBT is switched to the voltage level V3 as shown in FIG. 2B) and slightly lower than the voltage level of the node NG. That is to say, the difference between the voltage level of the node NG and the voltage level of the voltage signal SBT is still smaller than the on-state threshold voltage. Thus, both the charging switch QA and the unidirectional switch D2 in the pre-charge circuit 153 are turned off.

In brief, during the initial stage of the period P3, the voltage signal SBT at the bootstrap node BT is switched to the voltage level V3, so that the unidirectional switch D1, the charging switch QA and the unidirectional switch D2 are switched to the turned-off state. In such way, the bootstrap capacitor CBT is discharged towards the bootstrap node BT (the voltage difference $\Delta$VBT is decreased correspondingly), so that the voltage level of the voltage signal SBT starts decreasing from the voltage level V3.

In some practical applications, during the initial stage of the period P3, the voltage level of the voltage signal SSW at the switching node SW is 3.3 volts, the voltage level of the voltage signal SBT at the bootstrap node BT is 8.1 volts, and the voltage level of the node NG is 8.3 volts.

In accordance with the above descriptions, when the bootstrap capacitor CBT continues being discharged towards the bootstrap node BT, as shown in FIG. 2B, the voltage difference $\Delta$VBT is decreased gradually, and the voltage level of the voltage level SBT is decreased gradually. When the voltage difference $\Delta$VBT reaches the preset limit voltage level VLIM (e.g., a time point T1 as shown in FIGS. 2A and 2B) in response to the continuous decreasing, the voltage level of the voltage signal SBT at the bootstrap node BT reaches the voltage level of the output voltage VOUT plus the voltage difference $\Delta$VBT which is substantially equal to the preset limit voltage value VLIM (that is, the voltage signal SBT is switched to a voltage level V4 as shown in FIG. 2B). Also, as the above descriptions, the voltage level of the node NG is the voltage level of the output signal VOUT plus the fixed voltage VBS. Therefore, the difference between the voltage level of the node NG and the voltage level of the voltage signal SBT is substantially equal to the on-state threshold voltage. At this time, both the charging switch QA and the unidirectional switch D2 in the pre-charge circuit 153 are switched from the turned-off state to the turned-on state. That is to say, the pre-charge circuit 153 can start charging the bootstrap capacitor CBT (the voltage difference $\Delta$VBT is stopped from being decreased correspondingly), so that the voltage level of the voltage signal SBT is maintained at the voltage level V4. It should be understood that the voltage difference $\Delta$VBT reaches the preset limit voltage value VLIM from the preset voltage value VPS1 and is then maintained at the preset limit voltage value VLIM. In addition, during the period P3, the bootstrap capacitor CBT is discharged towards the bootstrap node BT until the voltage difference $\Delta$VBT reaches the preset limit voltage value VLIM from the preset voltage value VPS1.

From the above descriptions of the period P3 and FIG. 2B, it can be seen that a difference between the preset voltage value VPS1 and the preset limit voltage value VLIM is substantially the threshold voltage $V_{THQA}$ of the charging switch QA. Therefore, the voltage level of the voltage signal SBT at the bootstrap node BT is decreased from the voltage level V3 to the voltage level V4, which is equivalent to being decreased by the threshold voltage $V_{THQA}$ of the charging switch QA. That is to say, the voltage level V4 is equal to the voltage level V3 minus the threshold voltage $V_{THQA}$ of the charging switch QA. In addition, the charging switch QA and the unidirectional switch D2 are switched from the turned-off state to the turned-on state when the voltage level of the bootstrap node BT is decreased by the threshold voltage $V_{THQA}$.

In some practical applications, during the period P3, when both the charging switch QA and the unidirectional switch D2 are turned on, the voltage level of the voltage signal SSW at the switching node SW is 3.3 volts, the voltage level of the voltage signal SBT at the bootstrap node BT is 7.4 volts, preset limit voltage value VLIM is 4.1 volts, and the voltage level of the node NG is 8.3 volts.

Notably, by maintaining the voltage difference $\Delta$VBT between the two terminals of the bootstrap capacitor CBT at the preset limit voltage value VLIM in the discontinuous-conduction mode, when the high-side switch QH is required to be turned on (e.g., a period P4 directly following the period P3 as shown in FIGS. 2A and 2B), the driving circuit 13 can drive the high-side switch QH to switch to the turned-on state through the high-side driving signal GH with the enabled level without encountering the problems that the high-side switch QH cannot be turned on due to the over-discharge of the bootstrap capacitor CBT. Therefore, the power stage circuit 100, the bootstrap circuit 15 and the driving method 300 of the present disclosure have advantages of high stability.

During the period P4, both the pre-charge circuit 151 and the pre-charge circuit 153 do not charge the bootstrap capacitor CBT (which is similar to the operations related to the period P2), and the bootstrap capacitor CBT is discharged towards the bootstrap node BT. Therefore, as shown in FIG. 2B, the voltage difference ΔVBT between the two terminals of the bootstrap capacitor CBT is decreased from the preset limit voltage value VLIM. Then, during a period P5 directly following the period P4, the pre-charge circuit 151 charges the bootstrap capacitor CBT (which is similar to the operations related to the period P1). Therefore, as shown in FIG. 2B, the voltage difference ΔVBT between the two terminals of the bootstrap capacitor CBT is increased towards the preset voltage value VPS1. It should be understood that, in a late stage of the period P5, the voltage difference ΔVBT starts decreasing before reaching the preset voltage value VPS1 because the high-side switch QH is switched to the turned-on state.

In the above embodiments, during the period P2 or the period P4, the voltage level of the voltage signal SBT at the bootstrap node BT (i.e., the voltage level of the bootstrap node BT) might be higher than the voltage level of the power source signal VEE (the voltage level of the power source signal VEE is equal to the voltage level of the input signal VIN in some embodiments). At this time, the unidirectional switch D2 in the pre-charge circuit 153 can be operated with the reverse voltage, to prevent currents flowing from the bootstrap node BT towards the power source signal VEE.

In the above embodiments, the charging switch QA and the unidirectional switch D2 are controlled by the voltage source SV to be turned on or off in order to avoid the bootstrap capacitor CBT being charged directly with the power source signal VEE. If the bootstrap capacitor CBT is charged directly with the power source signal VEE, the high-side buffer circuit BH might been burnt or damaged because the voltage difference ΔVBT is over-high.

Figure 4:
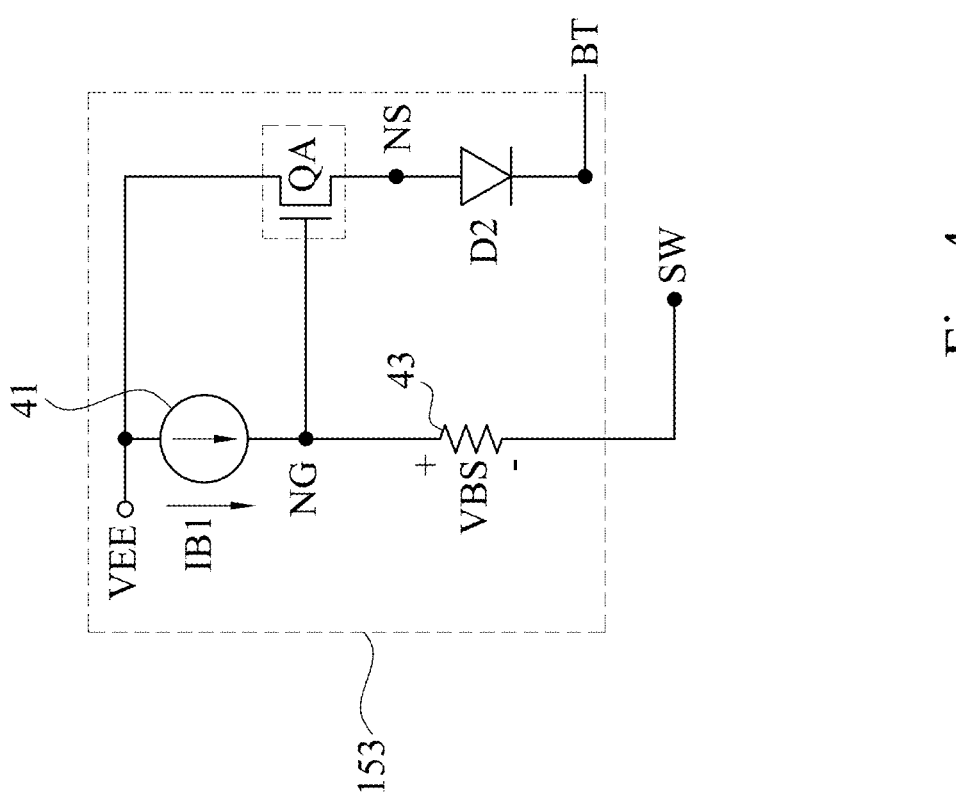
FIG. 4 is a circuit schematic diagram of a pre-charge circuit in accordance with some embodiments of the present disclosure.
Figure 5:
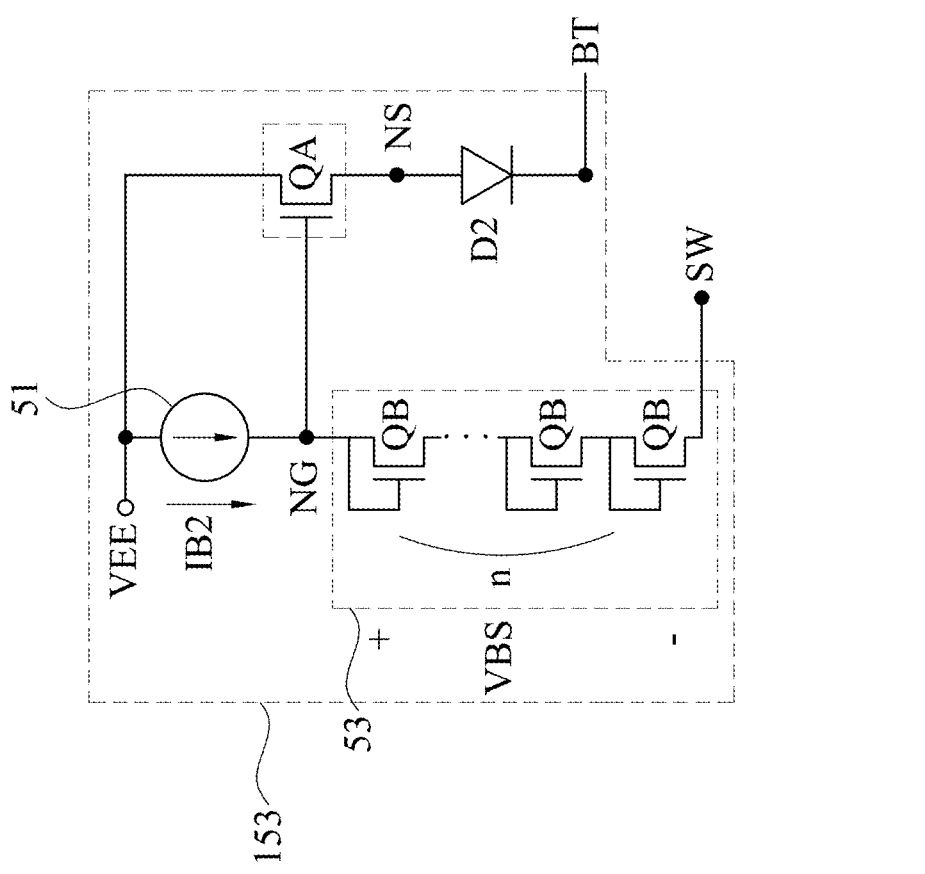
FIG. 5 is a circuit schematic diagram of a pre-charge circuit in accordance with some embodiments of the present disclosure.

The circuit structures of the pre-charge circuit 153 in the bootstrap circuit 15 would be described with reference to FIGS. 4 and 5. FIGS. 4 and 5 are circuit schematic diagrams of the pre-charge circuit 153 in accordance with some embodiments of the present disclosure.

In some embodiments, as shown in FIG. 4, the voltage source SV of the pre-charge circuit 153 in FIG. 1 is implemented by a current source 41 and a resistance element 43. In particular, the current source 41 is coupled to the power source signal VEE and the node NG, and the resistance element 43 is coupled to the node NG and the switching node SW. The current source 41 is configured to provide a fixed current IB1 to the node NG. The fixed current IB1 passes through the node NG, the resistance element 43 and the switching node SW sequentially, to from the fixed voltage VBS between two terminals of the resistance element 43. In this embodiment, the voltage level of the power source signal VEE is higher than a sum of the voltage level of the output signal VOUT and the fixed voltage VBS.

In some embodiments, as shown in FIG. 5, the voltage source SV of the pre-charge circuit 153 in FIG. 1 is implemented by a current source 51 and a transistor circuit 53. In particular, the current source 51 is coupled to the power source signal VEE and the node NG, and the transistor circuit 53 is coupled to the node NG and the switching node SW. The transistor circuit 53 includes n transistors QB. A drain terminal and a gate terminal of each transistor QB are coupled with each other, and the n transistors QB are cascaded. The current source 51 is configured to provide a fixed current IB2 to bias the n transistors QB, so that the fixed voltage VBS is formed between the node NG and the switching node SW. It should be understood that the fixed voltage VBS in FIG. 5 can be n times a threshold voltage of the transistor QB.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A power stage circuit comprising:
   a switch circuit comprising a low-side switch and a high-side switch, wherein the low-side switch and the high-side switch are coupled to a switching node of the power stage circuit;
   a driving circuit coupled to the low-side switch and the high-side switch and configured to drive the low-side switch and the high-side switch to be alternatively turned on according to a control signal; and
   a bootstrap circuit, coupled to the switch circuit and the driving circuit, comprising a bootstrap capacitor and a first pre-charge circuit, wherein the bootstrap capacitor is coupled to the switching node and a bootstrap node of the power stage circuit, wherein the first pre-charge circuit comprises a charging switch circuit and a voltage source, the voltage source is coupled to the switching node, and the charging switch circuit is coupled to the voltage source and the bootstrap node,
   wherein during a period when both the low-side switch and the high-side switch are turned off, the first pre-charge circuit is configured to charge the bootstrap capacitor when a voltage difference between two terminals of the bootstrap capacitor, which is decreased from a preset voltage value, reaches a preset limit voltage value, to maintain the voltage difference at the preset limit voltage value, and
   wherein the preset limit voltage value is determined according to a fixed voltage of the voltage source and an on-state threshold voltage of the charging switch circuit.

2. The power stage circuit of claim 1, wherein the charging switch circuit comprises a charging switch and a unidirectional switch, the charging switch and the unidirectional switch are coupled between the voltage source, a power source signal and the bootstrap node, and
   wherein during the period when both the low-side switch and the high-side switch are turned off, the bootstrap capacitor is discharged towards the bootstrap node until the voltage difference reaches the preset limit voltage value from the preset voltage value, and the charging switch and the unidirectional switch are switched from a turned-off state to a turned-on state when the voltage difference reaches the preset limit voltage value, so that the bootstrap capacitor is charged.

3. The power stage circuit of claim 2, wherein the on-state threshold voltage is determined by a threshold voltage of the charging switch and an on-state voltage of the unidirectional switch, and the preset limit voltage value is equal to the fixed voltage of the voltage source minus the on-state threshold voltage of the charging switch circuit.

4. The power stage circuit of claim 1, wherein the preset limit voltage value is equal to the fixed voltage of the voltage source minus the on-state threshold voltage of the charging switch circuit.

5. The power stage circuit of claim 1, wherein the bootstrap circuit further comprises a second pre-charge circuit, and the second pre-charge circuit is coupled to the bootstrap node and configured to charge the bootstrap capacitor during a period when the low-side switch is turned on, to increase the voltage difference to the preset voltage value, and wherein the first pre-charge circuit and the second pre-charge circuit are configured to stop charging the bootstrap capacitor during a period when the high-side switch is turned on.

6. The power stage circuit of claim 1, wherein the charging switch circuit is further coupled to a power source signal, and is configured to be turned on when the voltage difference reaches the preset limit voltage value from the preset voltage value, to maintain the voltage difference at the preset limit voltage value.

7. The power stage circuit of claim 1, wherein the bootstrap circuit further comprises a first unidirectional switch, and the first unidirectional switch is coupled to a first power source signal and the bootstrap node, and wherein during a period when the low-side switch is turned on, a voltage level of the switching node is switched to a ground voltage level, the first unidirectional switch is switched from a turned-off state to a turned-on state, to switch a voltage level of the bootstrap node to a first voltage level, and the bootstrap capacitor is charged according to the first voltage level and the ground voltage level, so that the voltage difference is increased to the preset voltage value.

8. The power stage circuit of claim 7, wherein the charging switch circuit comprises a charging switch and a second unidirectional switch, the voltage source is coupled to the switching node and the charging switch, the charging switch is coupled to a second power source signal, and the second unidirectional switch is coupled to the charging switch and the bootstrap node, and wherein during the period when both the low-side switch and the high-side switch are turned off, the voltage level of the switching node is switched to an output voltage level, the voltage level of the bootstrap node is switched to a second voltage level which is generated according to the output voltage level and the preset voltage value, the bootstrap capacitor is discharged towards the bootstrap node, so that the voltage level of the bootstrap node, which is decreased from the second voltage level, reaches a third voltage level, and the charging switch and the second unidirectional switch are switched from the turned-off state to the turned-on state when the voltage level of the bootstrap node reaches the third voltage level, so as to maintain the voltage level of the bootstrap node at the third voltage level.

9. The power stage circuit of claim 8, wherein during a period when the high-side switch is turned on, the voltage level of the switching node is switched to an input voltage level, the voltage level of the bootstrap node is switched to a fourth voltage level which is generated according to the input voltage level and the preset voltage value, so that the first unidirectional switch, the charging switch and the second unidirectional switch are switched to the turned-off state, and the bootstrap capacitor is discharged towards the bootstrap node.

10. The power stage circuit of claim 8, wherein the on-state threshold voltage is determined by a threshold voltage of the charging switch and an on-state voltage of the second unidirectional switch, and the preset limit voltage value is equal to the fixed voltage of the voltage source minus the on-state threshold voltage of the charging switch circuit.

11. The power stage circuit of claim 1, wherein the driving circuit comprises:

a driver configured to receive the control signal and configured to output a low-side driving signal and a high-side driving signal according to the control signal;

a low-side buffer circuit, wherein a signal input terminal of the low-side buffer circuit is coupled to the driver to receive the low-side driving signal, a signal output terminal of the low-side buffer circuit is coupled to the low-side switch, a power source terminal of the low-side buffer circuit is coupled to a first power source signal, and a ground terminal of the low-side buffer circuit is coupled to a ground signal; and a high-side buffer circuit, wherein a signal input terminal of the high-side buffer circuit is coupled to the driver to receive the high-side driving signal, a signal output terminal of the high-side buffer circuit is coupled to the high-side switch, a power source terminal of the high-side buffer circuit is coupled to the bootstrap node, and a ground terminal of the high-side buffer circuit is coupled to the switching node.

12. The power stage circuit of claim 11, wherein the high-side switch is further coupled to an input signal, the low-side switch is further coupled to the ground signal, the switching node is coupled to a load node through an inductance element, and the driving circuit is configured to drive the switch circuit to generate an output signal at the load node, and wherein a voltage level of the switching node is switched to a voltage level of the ground signal during a period when the low-side switch is turned on, the voltage level of the switching node is switched to a voltage level of the input signal during a period when the high-side switch is turned on, and the voltage level of the switching node is switched to a voltage level of the output signal during the period when both the low-side switch and the high-side switch are turned off.

13. A bootstrap circuit, applicable to a power stage circuit comprising a driving circuit, a high-side switch and a low-side switch, and comprising:

a bootstrap capacitor coupled to a switching node and a bootstrap node of the power stage circuit, wherein the high-side switch and the low-side switch are coupled to the switching node, and the driving circuit is coupled to the switching node and the bootstrap node;

a first pre-charge circuit coupled to the bootstrap node and configured to charge the bootstrap capacitor during a period when the low-side switch is turned on, to increase a voltage difference between two terminals of the bootstrap capacitor to a preset voltage value; and a second pre-charge circuit coupled to the switching node and the bootstrap node and configured to charge the bootstrap capacitor when the voltage difference, which is decreased from the preset voltage value, reaches a preset limit voltage value during a period when both the low-side switch and the high-side switch are turned off, to maintain the voltage difference at the preset limit voltage value, wherein the second pre-charge circuit comprises a voltage source and a charging switch circuit, the voltage source is coupled to the switching node, and the charging switch circuit is coupled to the voltage source and the bootstrap node, and wherein the preset limit voltage value is determined according to a fixed voltage of the voltage source and an on-state threshold voltage of the charging switch circuit.

14. The bootstrap circuit of claim 13, wherein during the period when both the low-side switch and the high-side switch are turned off, the bootstrap capacitor is discharged towards the bootstrap node until the voltage difference reaches the preset limit voltage value from the preset voltage value.

15. The bootstrap circuit of claim 13, wherein the charging switch circuit comprises a charging switch and a first unidirectional switch, the voltage source is coupled to the switching node and the charging switch, the charging switch is coupled to a first power source signal, and the first unidirectional switch is coupled to the charging switch and the bootstrap node, wherein during the period when both the low-side switch and the high-side switch are turned off, a voltage level of the switching node is switched to an output voltage level, a voltage level of the bootstrap node is switched to a first voltage level which is generated according to the output voltage level and the preset voltage value, the bootstrap capacitor is discharged towards the bootstrap node, so that the voltage level of the bootstrap node, which is decreased from the first voltage level, reaches a second voltage level, and the charging switch and the first unidirectional switch are switched from a turned-off state to a turned-on state when the voltage level of the bootstrap node reaches the second voltage level, so as to maintain the voltage level of the bootstrap node at the second voltage level, wherein the on-state threshold voltage is determined by a threshold voltage of the charging switch and an on-state voltage of the first unidirectional switch, and the preset limit voltage value is equal to the fixed voltage of the voltage source minus the on-state threshold voltage of the charging switch circuit.

16. The bootstrap circuit of claim 15, wherein the first pre-charge circuit comprises a second unidirectional switch, and the second unidirectional switch is coupled to a second power source signal and the bootstrap node, wherein during the period when the low-side switch is turned on, the voltage level of the switching node is switched to a ground voltage level, the second unidirectional switch is switched from the turned-off state to the turned-on state, to switch the voltage level of the bootstrap node to a third voltage level, and the bootstrap capacitor is charged according to the third voltage level and the ground voltage level, so that the voltage difference is increased to the preset voltage value.

17. The bootstrap circuit of claim 16, wherein during a period when the high-side switch is turned on, the voltage level of the switching node is switched to an input voltage level, the voltage level of the bootstrap node is switched to a fourth voltage level which is generated according to the input voltage level and the preset voltage value, so that the first unidirectional switch, the charging switch and the second unidirectional switch are switched to the turned-off state, and the bootstrap capacitor is discharged towards the bootstrap node.

18. The bootstrap circuit of claim 13, wherein the preset limit voltage value is equal to the fixed voltage of the voltage source minus the on-state threshold voltage of the charging switch circuit.

19. A driving method, applicable to a bootstrap circuit of a power stage circuit, and comprising:

during a period when a low-side switch of the power stage circuit is turned on, charging, by a first pre-charge circuit of the bootstrap circuit, a bootstrap capacitor of the bootstrap circuit, to increase a voltage difference between two terminals of the bootstrap capacitor to a preset voltage value;

during a period when a high-side switch of the power stage circuit is turned on, discharging the bootstrap capacitor towards a bootstrap node coupled to the first pre-charge circuit and the bootstrap capacitor; and during a period when both the low-side switch and the high-side switch are turned off, charging, by a second pre-charge circuit of the bootstrap circuit, the bootstrap capacitor when the voltage difference, which is decreased from the preset voltage value, reaches a preset limit voltage value, to maintain the voltage difference at the preset limit voltage value, wherein the second pre-charge circuit comprises a voltage source and a charging switch circuit, the charging switch circuit is coupled to the voltage source and the bootstrap node, and the preset limit voltage value is determined according to a fixed voltage of the voltage source and an on-state threshold voltage of the charging switch circuit.

20. The driving method of claim 19, wherein the charging switch circuit comprises a charging switch and a unidirectional switch, the on-state threshold voltage is determined by a threshold voltage of the charging switch and an on-state voltage of the unidirectional switch, and the preset limit voltage value is equal to the fixed voltage of the voltage source minus the on-state threshold voltage of the charging switch circuit.

* * * * *